(12) United States Patent
Ikeda et al.

(10) Patent No.: US 12,430,284 B2
(45) Date of Patent: Sep. 30, 2025

(54) ARITHMETIC OPERATION DEVICE, TESTING METHOD

(71) Applicant: HITACHI ASTEMO, LTD., Hitachinaka (JP)

(72) Inventors: Yasuhiro Ikeda, Tokyo (JP); Tadanobu Toba, Tokyo (JP); Kenichi Shimbo, Tokyo (JP); Atsushi Arata, Hitachinaka (JP); Takeo Yamashita, Hitachinaka (JP); Atsushi Ichige, Hitachinaka (JP); Shinichi Nonaka, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 166 days.

(21) Appl. No.: 18/036,029

(22) PCT Filed: Aug. 31, 2021

(86) PCT No.: PCT/JP2021/032024
§ 371 (c)(1),
(2) Date: May 9, 2023

(87) PCT Pub. No.: WO2022/102220
PCT Pub. Date: May 19, 2022

(65) Prior Publication Data
US 2023/0409518 A1    Dec. 21, 2023

(30) Foreign Application Priority Data
Nov. 13, 2020 (JP) ................. 2020-189860

(51) Int. Cl.
*G06F 15/78* (2006.01)
*G01R 31/3185* (2006.01)
*G06F 15/177* (2006.01)

(52) U.S. Cl.
CPC .. *G06F 15/7892* (2013.01); *G01R 31/318516* (2013.01); *G06F 15/177* (2013.01)

(58) Field of Classification Search
None
See application file for complete search history.

(56) References Cited

U.S. PATENT DOCUMENTS 6,530,049 B1 *  3/2003  Abramovici ........ G06F 11/1428
                                            714/E11.111
6,550,030 B1    4/2003  Abramovici et al.
(Continued)

FOREIGN PATENT DOCUMENTS

JP    H11-44741 A     2/1999
JP    2001-144261 A   5/2001
(Continued)

OTHER PUBLICATIONS

International Search Report of PCT/JP2021/032024 dated Nov. 22, 2021.
(Continued)

*Primary Examiner* — Anh Q Tran
(74) *Attorney, Agent, or Firm* — MATTINGLY & MALUR, PC

(57) ABSTRACT

An arithmetic operation device executes a test using a partially reconfigurable programmable logic unit, the programmable logic unit includes a test target circuit which is a user circuit, and a non-test circuit which is a user circuit which is not the test target circuit, and the arithmetic operation device includes a configuration control unit which causes the programmable logic unit to form, by partial reconfiguration, a test partition unit which separates the test target circuit and the non-test circuit, and a partition control unit which controls the test partition unit to test the test target circuit.

8 Claims, 14 Drawing Sheets

(56) References Cited

U.S. PATENT DOCUMENTS

| | | | |
|---|---|---|---|
| 6,574,761 B1 | 6/2003 | Abramovici et al. | |
| 6,631,487 B1 * | 10/2003 | Abramovici ... | G01R 31/318519 326/23 |
| 7,234,120 B1 * | 6/2007 | Staab ............ | G01R 31/318342 716/136 |
| 8,686,753 B1 * | 4/2014 | Herrmann ........ | H03K 19/17756 714/39 |
| 2007/0234160 A1 | 10/2007 | Oota et al. | |

FOREIGN PATENT DOCUMENTS

| | | |
|---|---|---|
| JP | 2007-264995 A | 10/2007 |
| JP | 2010-054402 A | 3/2010 |

OTHER PUBLICATIONS

Chinese Office Action received in corresponding Chinese Application No. 202180075356.X dated Aug. 5, 2025

* cited by examiner

FIG. 8

| TIME | UL1 | UL2 | UL3 | UL4 | UL5 |
|---|---|---|---|---|---|
| t1 | WRITE ALL USER CIRCUITS | | | | |
| t2 | WRITE TPG | NONE | WRITE ORA | WRITE ORA | NONE |
| t3 | TEST UL2 | | | | |
| t4 | NONE | WRITE TPG | WRITE USER CIRCUIT | WRITE ORA | NONE |
| t5 | TEST UL3 | | | | |
| t6 | NONE | WRITE TPG | WRITE TPG | WRITE USER CIRCUIT | WRITE ORA |
| t7 | TEST UL4 | | | | |

ARITHMETIC OPERATION DEVICE, TESTING METHOD

TECHNICAL FIELD

The present invention relates to an arithmetic operation device and a testing method.

BACKGROUND ART

A stereo camera and an electronic control device which support autonomous driving and advanced driving assist systems are required to perform high-performance data processing to utilize sensor information for driving control. A reconfigurable logic circuit is used as a device in charge of this data processing in some cases. Furthermore, in-vehicle electronic systems are required to provide high reliability in a background that ISO 26262 which is functional safety standards needs to be met. Among in-vehicle electronic systems, there is a technique for testing a reconfigurable logic circuit in a short time while ensuring high reliability of the reconfigurable logic circuit as disclosed in, for example, PTL 1. PTL 1 discloses a programmable logic device testing method which detects a failure of a programmable logic device including a programmable logic block whose function is set by writing program data in a memory, and includes a first step of loading the program data into the memory to configure a self-testing circuit for a test target block in the programmable logic device using a programmable logic block other than the test target block in the programmable logic device, and a second step of testing the test target block by the self-testing circuit.

CITATION LIST

Patent Literature

PTL 1: JP H11-44741 A

SUMMARY OF INVENTION

Technical Problem

The invention described in PTL 1 has a room for study to shorten the test time.

Solution to Problem

An arithmetic operation device according to a first aspect of the present invention is an arithmetic operation device which executes a test using a partially reconfigurable programmable logic unit, in which the programmable logic unit includes a test target circuit which is a user circuit, and a non-test circuit which is a user circuit which is not the test target circuit, and which includes: a configuration control unit which causes the programmable logic unit to form by partial reconfiguration a test partition unit which separates the test target circuit and the non-test circuit; and a partition control unit which controls the test partition unit to test the test target circuit.

A testing method according to a second aspect of the present invention is a testing method which is executed by a computer using a partially reconfigurable programmable logic unit, and includes: causing the programmable logic unit to form a test partition unit by partial reconfiguration, the programmable logic unit including a test target circuit which is a user circuit, and a non-test circuit which is a user circuit which is not the test target circuit, the test partition unit separating the test target circuit and the non-test circuit; and controlling the test partition unit to test the test target circuit.

Advantageous Effects of Invention

According to the present invention, it is possible to shorten a test time.

BRIEF DESCRIPTION OF DRAWINGS

FIG. 8 is a view illustrating an example of a time chart.

DESCRIPTION OF EMBODIMENTS

Hereinafter, embodiments according to an electronic control device and a testing method according to the present invention will be described with reference to the drawings. However, the embodiments described below are merely examples, and do not intend to exclude application of various modified examples and techniques which are not explicitly described in the embodiments. That is, the present embodiment can be variously modified and carried out without departing from the gist thereof. Furthermore, each drawing does not suggest that only components illustrated in each drawing are included, and may include other functions and the like.

First Embodiment

Figure 1:
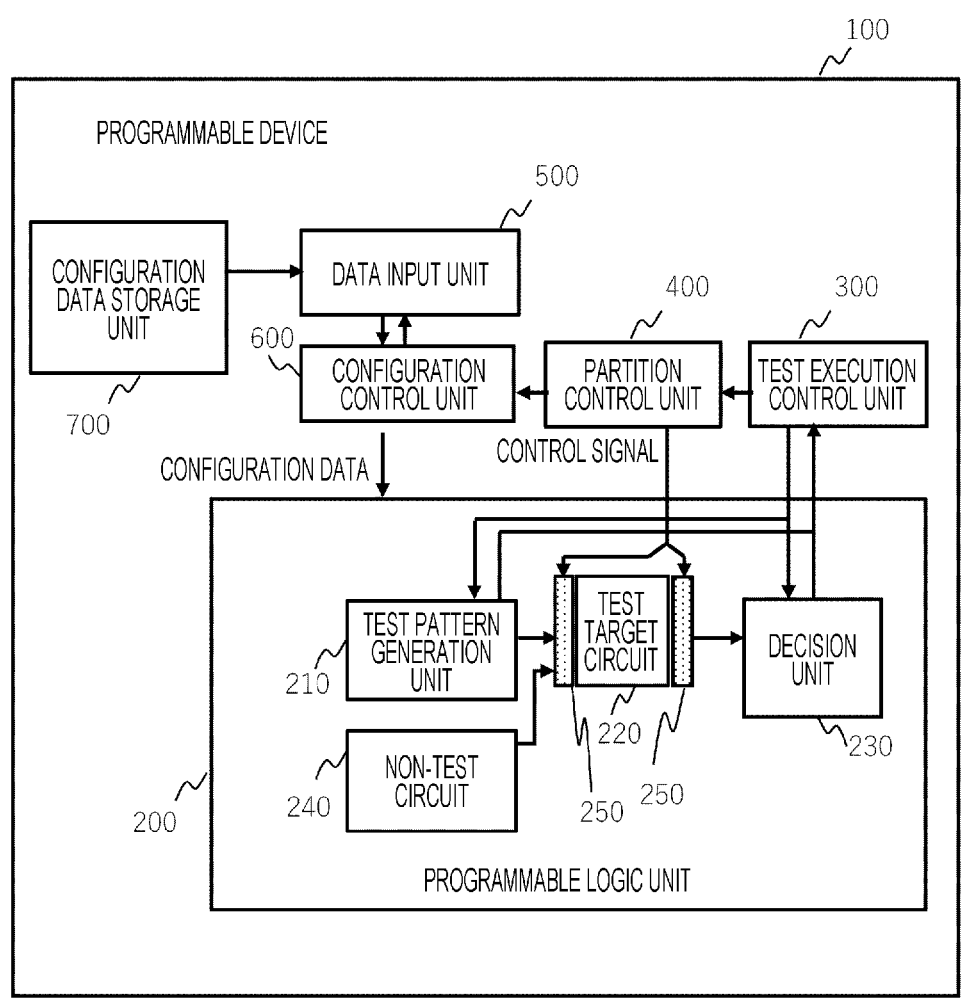
FIG. 1 is a schematic diagram of a test which uses a programmable device.

Hereinafter, a first embodiment of a programmable device which is an arithmetic operation device will be described with reference to FIGS. 1 to 8.
(Schematic Diagram)
FIG. 1 is a schematic diagram of a test which uses a programmable device (referred to as a "PLD" below) 100. The PLD 100 includes a programmable logic unit 200, a test execution control unit 300, a partition control unit 400, a data input unit 500, a configuration control unit 600, and a configuration data storage unit 700. The programmable logic unit 200 is a partially reconfigurable logic circuit. Configuration data to be written in the programmable logic unit 200 is supplied from the configuration data storage unit 700.

Various logic circuits can be configured in the programmable logic unit 200. These logic circuits are classified into vendor logic circuits provided by vendors who are manufacturers of the programmable logic unit 200, and user logic circuits created by people other than the manufacturers of the programmable logic unit 200. The present embodiment will describe a test which targets at these user logic circuits.

In a case where a System on Chip (SoC) type is used as the programmable device 100, the test execution control unit 300, the partition control unit 400, the data input unit 500, the configuration control unit 600, and the configuration data storage unit 700 may be realized by the programmable logic unit 200, or may be realized by a CPU which is a central processing unit. Furthermore, the test execution control unit 300, the partition control unit 400, the data input unit 500, and the configuration control unit 600 may be realized by one or more microcomputers, and the configuration data storage unit 700 may be realized by an ROM.

In the example illustrated in FIG. 1, the programmable logic unit 200 includes a test pattern generation unit 210, a test target circuit 220, a decision unit 230, a non-test circuit 240, and a test partition unit 250. The test target circuit 220 and the non-test circuit 240 are corresponding concepts, and, in the present embodiment, a user circuit which is a target of a certain test is referred to as the test target circuit 220, and a user circuit which is not the test target of this certain test is referred to as the non-test circuit 240. That is, the test target circuit 220 and the non-test circuit 240 do not refer to specific user circuits, but are changed per test. Note that the non-test circuit 240 may also be referred to as a "non-test target circuit".

The test execution control unit 300 instructs a test of the test target circuit 220. More specifically, the test execution control unit 300 outputs an operation command to the test pattern generation unit 210, the decision unit 230, and the partition control unit 400, and receives a response from the test pattern generation unit 210 and the decision unit 230. The partition control unit 400 outputs an operation command to the test partition unit 250 and the configuration control unit 600 based on the command from the test execution control unit 300. The configuration control unit 600 receives configuration data from the configuration data storage unit 700 via the data input unit 500 based on the operation command from the partition control unit 400, and writes the configuration data in the programmable logic unit 200. More specifically, the configuration control unit 600 writes the test pattern generation unit 210, the test target circuit 220, the decision unit 230, the non-test circuit 240, and the test partition unit 250.

Figure 2:
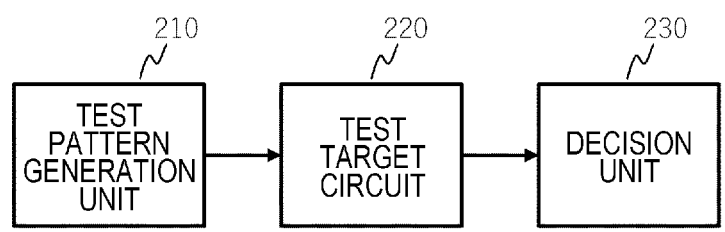
FIG. 2 is a schematic diagram of a test.

FIG. 2 is a schematic diagram of a test according to the present embodiment. FIG. 2 illustrates only core components of the test, and omits illustration of the test partition unit 250 and the like which do not influence the test itself. As illustrated in FIG. 2, in the present embodiment, the test pattern generation unit 210 generates a test pattern, and applies the test pattern to the test target circuit 220. Furthermore, the decision unit 230 compares an output result of the test target circuit 220 with an expected value, and outputs a comparison result to the test execution control unit 300. Note that this testing method is a method which is generally used in a Built-In Self Test (BIST). Back to FIG. 1, the description continues.

The configuration data storage unit 700 stores configuration data which is configuration information to be written in the programmable logic unit 200. In the present embodiment, first, various user logic circuits are formed in the programmable logic unit 200 by configuration, and the test execution control unit 300 determines the test target circuit 220 from the plurality of these user logic circuits. Furthermore, the test execution control unit 300 implements the test pattern generation unit 210 and the decision unit 230 by partial reconfiguration in a region of another divided user logic circuit having an input/output relationship with the test target circuit 220, and conducts a test.

In this test, first, the partition control unit 400 causes the test partition unit 250 to perform separation. When completing the separation, the configuration control unit 600 rewrites a desired user logic circuit by partial reconfiguration using the configuration data of the test circuit from the configuration data storage unit 700 including the information of a partition unit via the data input unit 500. Thereafter, the test partition unit 250 is switched from a separated state to a connected state to conduct the test.

Example of Implementation

Figure 3:
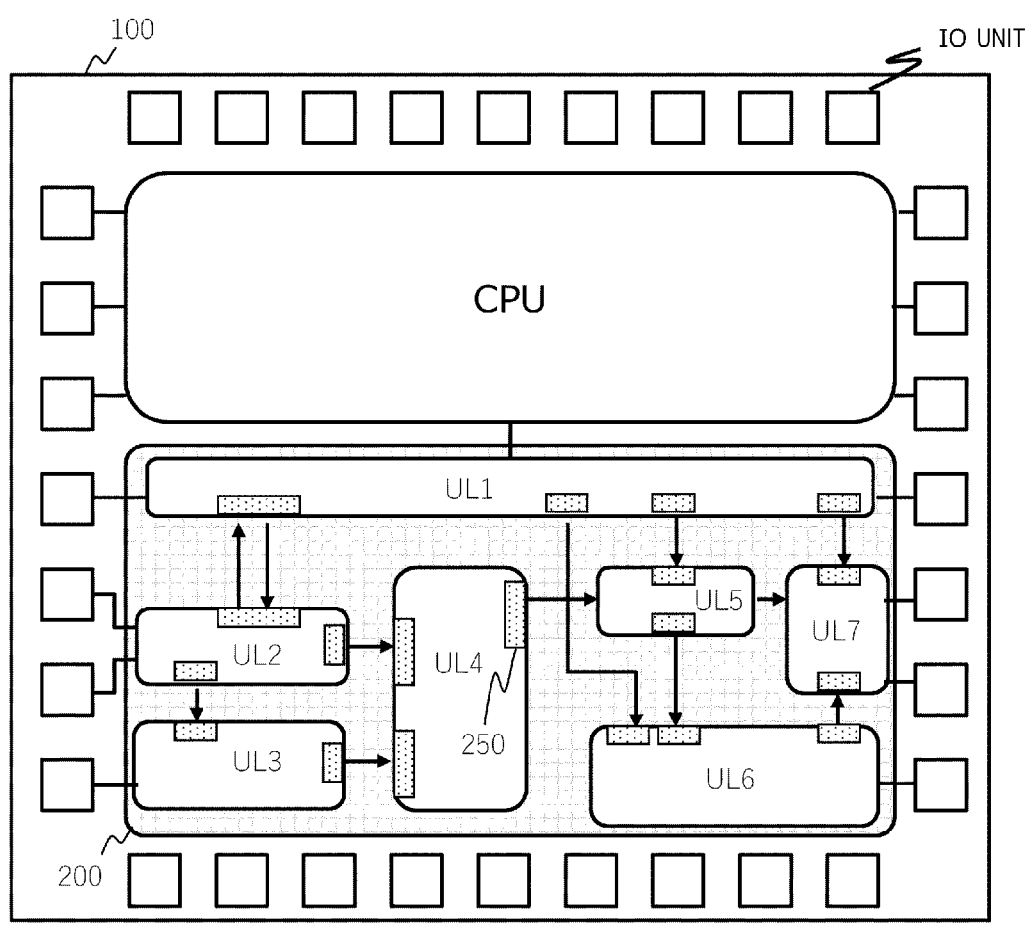
FIG. 3 is a view illustrating an example of implementation in the programmable device.
Figure 4:
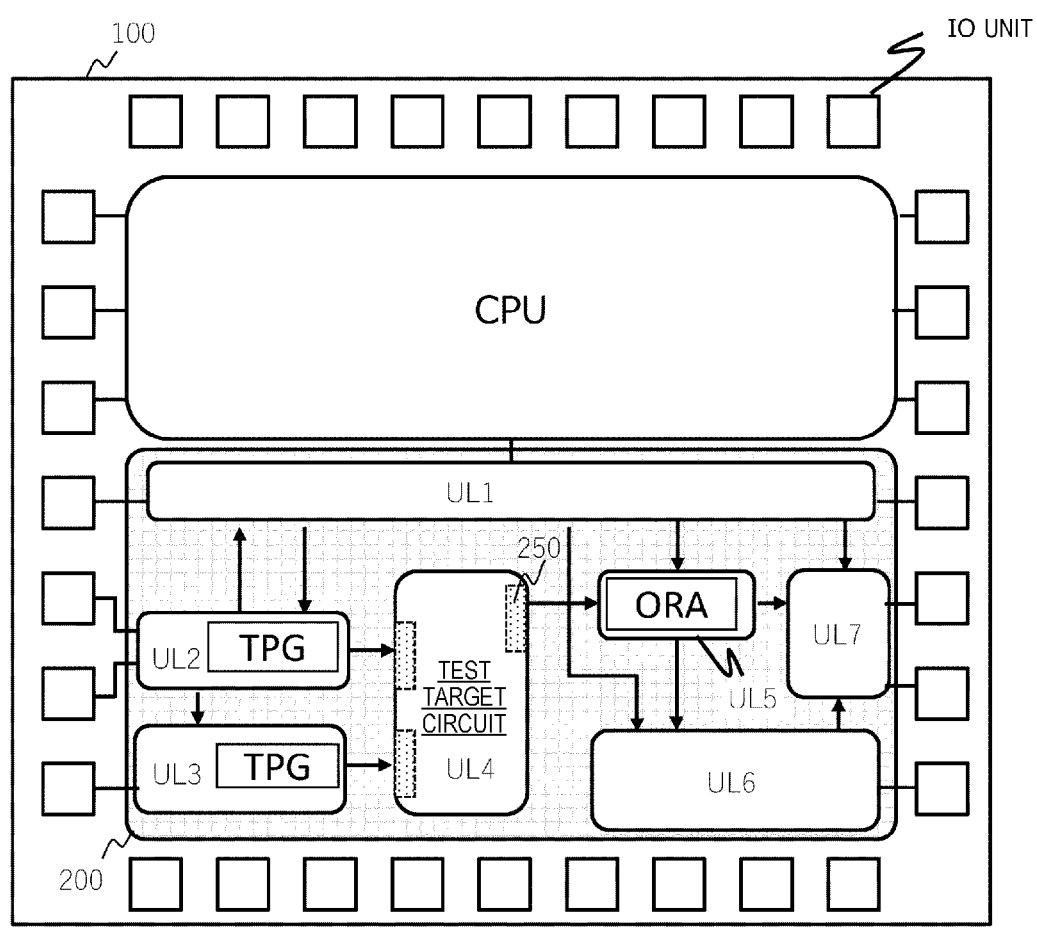
FIG. 4 is a view illustrating an example of implementation in the programmable device.
Figure 5:
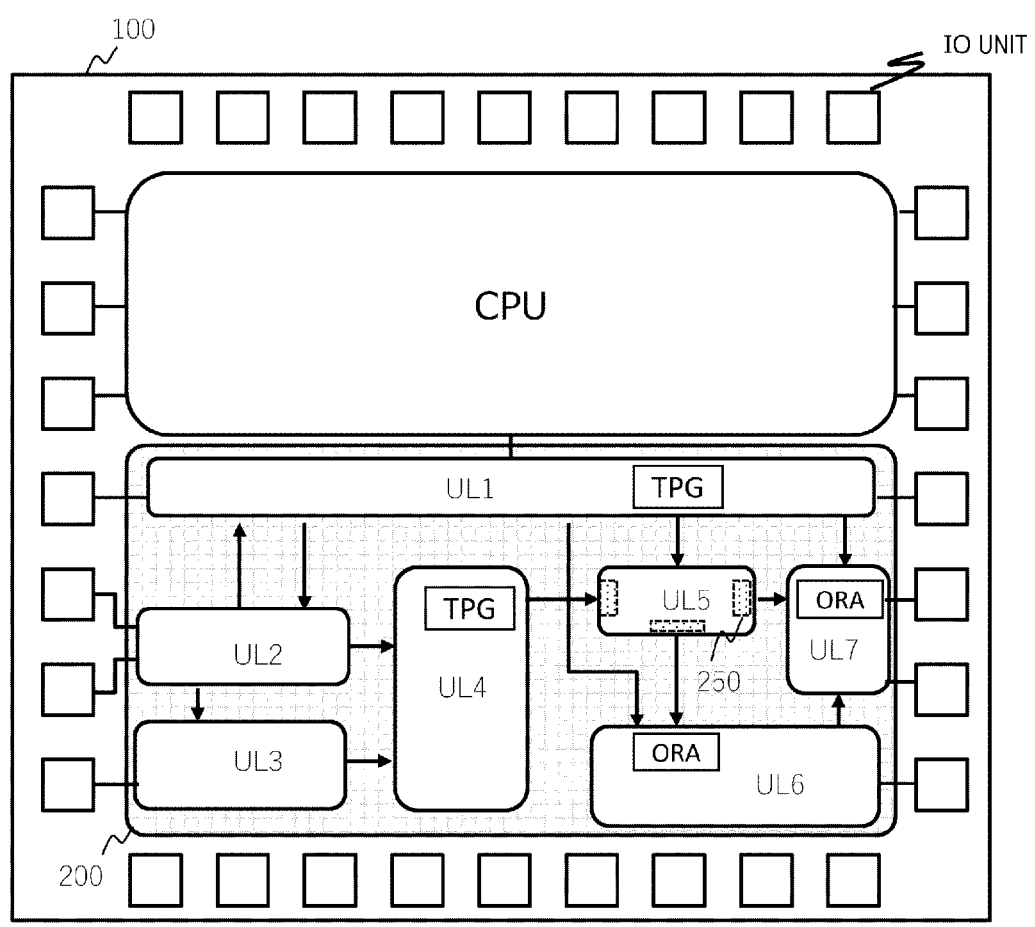
FIG. 5 is a view illustrating an example of implementation in the programmable device.

FIGS. 3 to 5 are views illustrating examples where the SoC type is implemented on the programmable device 100. However, in FIGS. 3 to 5, the test pattern generation unit 210 is illustrated as a "TPG" (Test Pattern Generator), and the decision unit 230 is illustrated as an "ORA" (Output Response Analyzer) for convenience of drawing.

In the example illustrated in FIG. 3, seven user logic circuits UL 1 to UL 7 are formed in the programmable logic unit 200. In the example illustrated in FIG. 3, to target at all these seven user logic circuits as test targets, the test partition units 250 are formed at all the connection portions between the user logic circuits. Note that, although FIG. 3 illustrates reference numeral 250 only at one place for convenience of drawing, all figures indicated by similar hatchings represent the test partition units 250. The same applies to the following drawings. A function of the test partition unit 250 will be described in detail with reference to FIG. 4.

In the example illustrated in FIG. 4, the UL 4 is selected as the test target user logic circuit. The UL 4 performs an arithmetic operation using inputs from the UL 2 and the UL 3, and outputs an arithmetic operation result to the UL 5. Therefore, when the UL 4 is targeted as the test target, the TPGs are arranged in the UL 2 and the UL 3, and the ORA is arranged in the UL 5.

To make a state where the UL 1 to the UL 7 are formed by configuration transition to a state illustrated in FIG. 4, it is necessary to write the TPGs in the UL 2 and the UL 3 by partial reconfiguration, and write the ORA in the UL 5 by partial reconfiguration. However, when these TPGs and ORA are written by the partial reconfiguration, values of input/output terminals of the circuits during the partial reconfiguration become indefinite. Furthermore, initial values of the circuits after the partial reconfiguration are also indefinite. Since these indefinite values adversely affects the test, the test partition units 250 for separating and connecting the circuits are provided in the respective circuits to be partially reconfigured. Furthermore, these test partition units 250 are provided with an intention of not outputting unstable outputs during partial reconfiguration to non-test target user logic circuits.

In the example illustrated in FIG. 5, the UL 5 is selected as the test target user logic circuit. The UL 5 performs an arithmetic operation using inputs from the UL 1 and the UL 4, and outputs arithmetic operation results to the UL 6 and the UL 7. Although it is necessary to write the TPG in the UL 1 by partial reconfiguration, the UL 1 operates in response to an output from the CPU, so that it is possible to temporarily stop the output from the UL 1 to the UL 5 by controlling the CPU when the test is executed. Therefore, in the example illustrated in FIG. 5, the test partition unit 250 is not provided at the connection portion of the UL 5 with the UL 1.

Figure 6:
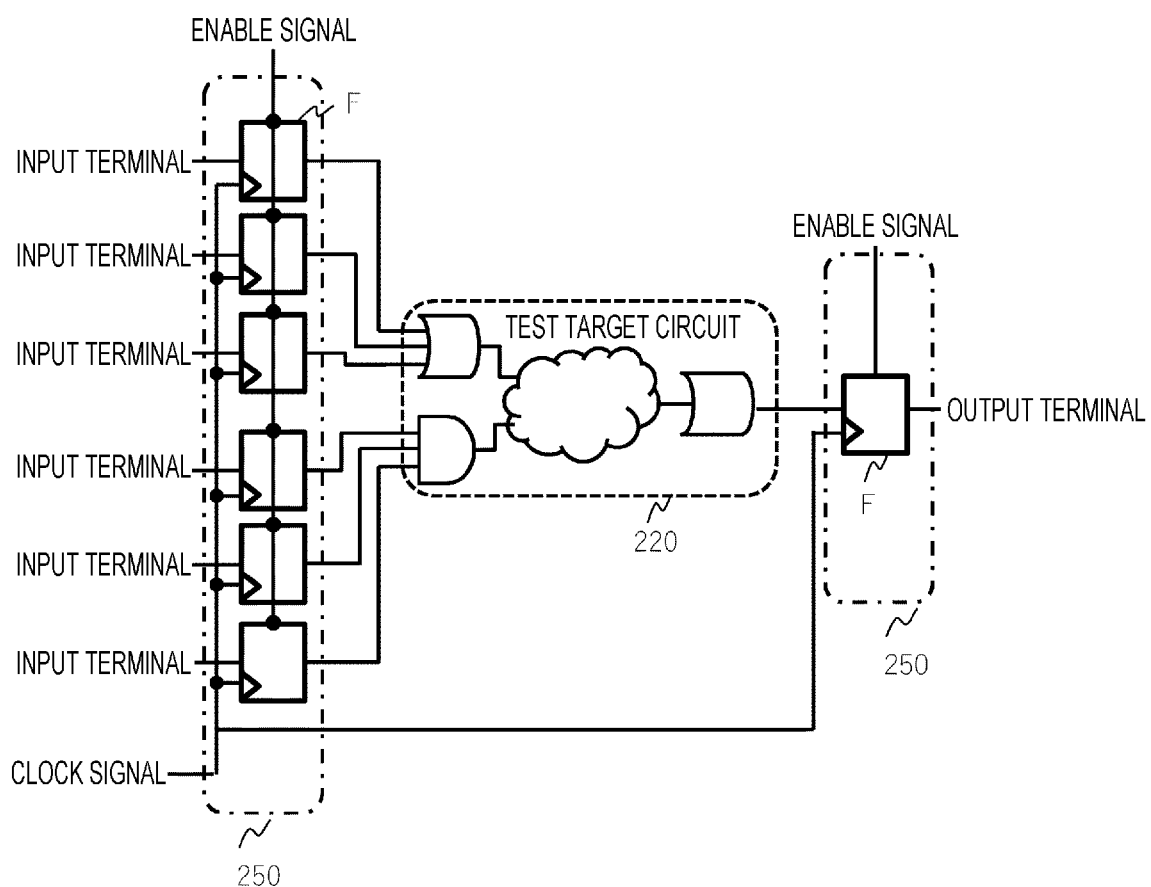
FIG. 6 is a view illustrating a configuration example of a test partition unit.

FIG. 6 is a view illustrating a configuration example of the test partition unit 250. As illustrated in FIG. 6, the test partition unit 250 can be realized by, for example, one or more flip-flops F having enable signal terminals. The number of flip-flops F included in the test partition unit 250 is the same as the number of terminals to be connected. The enable signal input to the flip-flop F is output by the partition control unit 400. The partition control unit 400 can control the test partition unit 250 using the enable signal to realize separation and connection between the test target circuit 220 and the non-test circuit 240.

(Flowchart)

Figure 7:
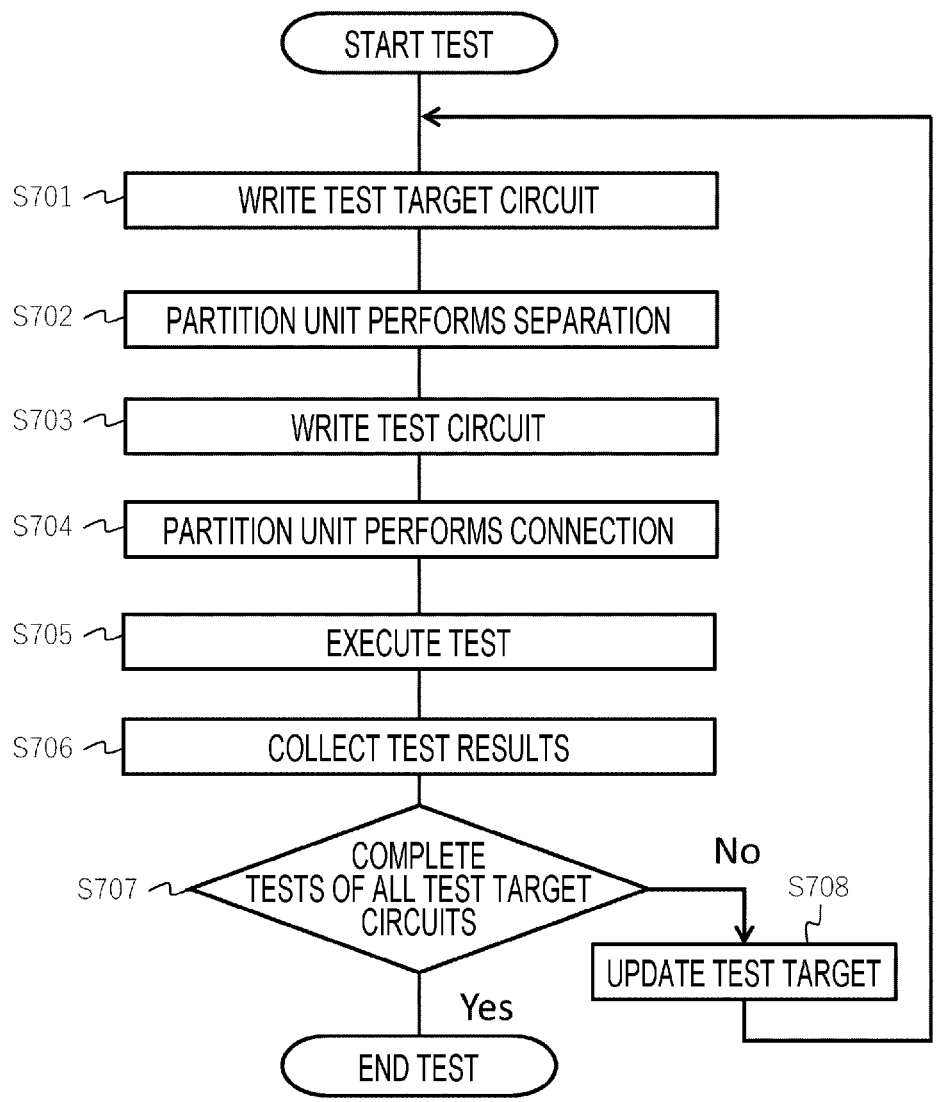
FIG. 7 is a flowchart illustrating a series of flow of a test.

FIG. 7 is a flowchart illustrating a series of flow of the test. An execution subject of each step described below is the test execution control unit 300. First, in step S701, the test execution control unit 300 causes the configuration control unit 600 to write the test target circuit 220. However, in a case where the test target circuit 220 is provided in the programmable logic unit 200, step S701 can be omitted. In, for example, a case where the test pattern generation unit 210 is written for a purpose of testing another circuit, and therefore part or entirety of the test target circuit 220 is overwritten, step S701 is executed.

In subsequent step S702, the test execution control unit 300 uses the partition control unit 400 to cause the test partition unit 250 to separate the test target circuit 220 and the non-test circuit 240. In subsequent step S703, the test execution control unit 300 writes the test pattern generation unit 210 and the decision unit 230 using the configuration control unit 600. In subsequent step S704, the test execution control unit 300 uses the partition control unit 400 to cause the test partition unit 250 to connect the test target circuit 220 and the non-test circuit 240. In subsequent step S705, the test execution control unit 300 instructs the test pattern generation unit 210 to generate a test pattern, and executes a test.

In subsequent step S706, the test execution control unit 300 collects test results from the decision unit 230, in other words, receives decision results. In subsequent step S707, the test execution control unit 300 decides whether or not the tests of all the test target user logic circuits have been completed, and, when deciding that there is a circuit which has not been tested, updates the test target circuit 220 in step S708, and returns to step S701. When deciding that the tests of all the test target user logic circuits have been completed, the test execution control unit 300 finishes the processing illustrated in FIG. 7.

(Time Chart)

FIG. 8 is a view illustrating an example of the time chart of the programmable device 100. A time passes from an upper part to a lower part in FIG. 8, and the user logic circuits UL 1 to UL 5 are illustrated in a horizontal direction. Although the UL 1 to the UL 5 correspond to those in the examples illustrated in FIGS. 3 to 5, illustration of the UL 5 and subsequent ULs is omitted for convenience of drawing. Furthermore, FIG. 8 omits illustration and description of writing of the test partition unit 250. In the example illustrated in FIG. 8, the UL 2, the UL 3, and the UL 4 are set as the test target circuit in this order.

At a time t1, all user logic circuits are written by normal reconfiguration processing. At a time t2, to execute a test targeting at the UL 2 as a test target circuit, the test pattern generation unit 210 is written in the UL 1, and the decision units 230 are written in the UL 3 and the UL 4 by partial reconfiguration. At a time t3, the UL 2 is tested.

At a time t4, to execute a test targeting at the UL 3 as a test target circuit, the test pattern generation unit 210 is written in the UL 2, the decision unit 230 is written in the UL 4, and the user logic circuit is written in the UL 3 by partial reconfiguration. The decision unit 230 is written in the UL 3 at the time t2, and therefore part of the user logic circuit written in the UL 3 at the time t1 has been overwritten. The UL 3 cannot be tested in this state, and therefore the user logic circuit of the UL 3 is written again by partial reconfiguration at the time t4. Note that the decision unit 230 is already written in the UL 4 at the time t2, so that, when the decision unit 230 which decides the output of the UL 2 can also decide the output of the UL 4, it is possible to omit writing of the decision unit 230 in the UL 4 at the time t4. At a time t5, the UL 3 is tested.

At a time t6, to execute a test targeting at the UL 4 as a test target circuit, the test pattern generation units 210 are written in the UL 2 and the UL 3, the decision unit 230 is written in the UL 5, and the user logic circuit is written in the UL 4 by partial reconfiguration. The decision unit 230 is written in the UL 4 at times t2 and t4, and therefore part of the user logic circuit written in the UL 4 at the time t1 has been overwritten. The UL 4 cannot be tested in this state, and therefore the user logic circuit of the UL 4 is written again by partial reconfiguration at the time t6. Note that, as described above, there is a case where writing of the test pattern generation unit 210 in the UL 2 can be omitted. At a time t7, the UL 4 is tested.

According to the above-described first embodiment, following functions and effects can be obtained.

(1) The programmable device 100 which is the arithmetic operation device executes a test using the partially reconfigurable programmable logic unit 200. The programmable logic unit 200 includes the test target circuit 220 which is the user circuit, and the non-test circuit 240 which is the user circuit which is not the test target circuit 220, and includes the configuration control unit 600 which causes the programmable logic unit 200 to form by partial reconfiguration the test partition unit 250 which separates the test target circuit 220 and the non-test circuit 240, and the partition control unit 400 which controls the test partition unit 250 to test the test target circuit 220. Consequently, by separating the test target circuit 220 and the non-test circuit 240 using the test partition unit 250, it is possible to suppress an influence of, for example, output of an unstable signal on the non-test circuit 240 at a time of writing by the partial reconfiguration. Consequently, it is possible to execute a test without rewriting the entire programmable logic unit 200, and shorten a test time.

(2) The partition control unit 400 switches between a separated state and a connected state between the test target circuit 220 and the non-test circuit 240. Consequently, it is possible to execute the test while leaving the partition unit 250.

(3) The configuration control unit 600 further writes in the programmable logic unit 200 by partial reconfiguration the test pattern generation unit 210 which generates a signal for a test and outputs the signal to the test target circuit, and the decision unit 230 which decides the output of the test target circuit 220. The programmable device 100 includes the test execution control unit 300 which transmits an operation command to the partition control unit 400 and the test pattern generation unit 210, and receives a decision result from the decision unit 230. Consequently, it is possible to write the test pattern generation unit 210 and the decision unit 230 necessary for the test by partial reconfiguration, and execute the test.

(4) The configuration control unit 600 writes the test target circuit 220 in the programmable logic unit 200 by partial reconfiguration as at the time t4 and the time t6 in FIG. 8. It is possible to write again the test target circuit 220 overwritten by writing the test pattern generation unit 210 and the decision unit 230 for another test, and execute the test.

Modified Example 1

Figure 9:
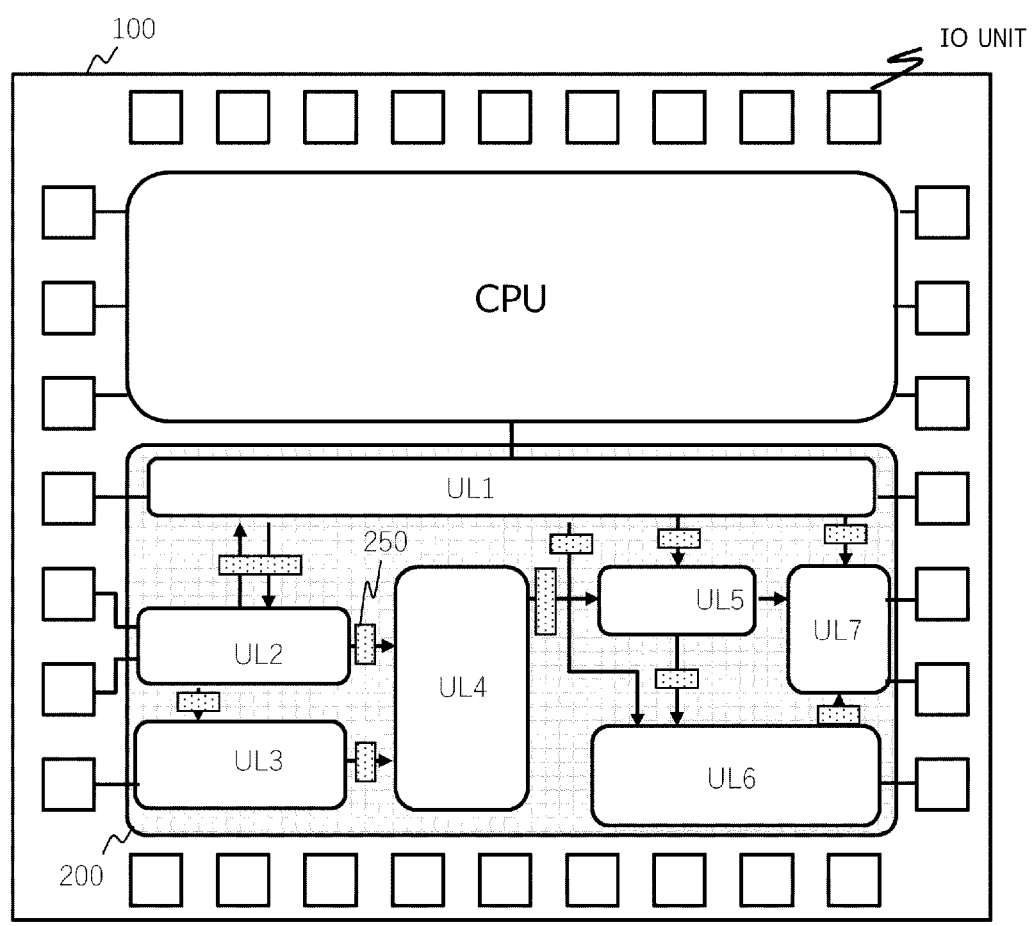
FIG. 9 is a view illustrating a test partition unit according to modified example 1.

FIG. 9 is a view illustrating the test partition unit 250 according to modified example 1. In the above-described first embodiment, the test partition unit 250 is implemented inside the user logic circuit. However, as illustrated in FIG. 9, the test partition unit 250 may be implemented outside the user logic circuit, that is, on an input/output signal wiring to the user logic circuit.

Modified Example 2

In the above-described first embodiment, the test partition units 250 are provided at both the input terminal and the output terminal of the test target circuit 220. However, there may be employed a configuration where the test partition unit 250 is provided at only one of the input terminal and the output terminal of the test target circuit 220. For example, when the decision unit 230, the test target circuit 220, and the test pattern generation unit 210 are written in this order by partial reconfiguration, in other words, when the test pattern generation unit 210 is written last among three of these units and circuit, the test partition unit 250 on the input terminal side of the test target circuit 220 may not be provided.

Modified Example 3

In the above-described first embodiment, all signals input to the test target circuit 220 are signals generated by the test pattern generation unit 210. However, an output of the non-test circuit 240 may be input to the test target circuit 220.

Figure 10:
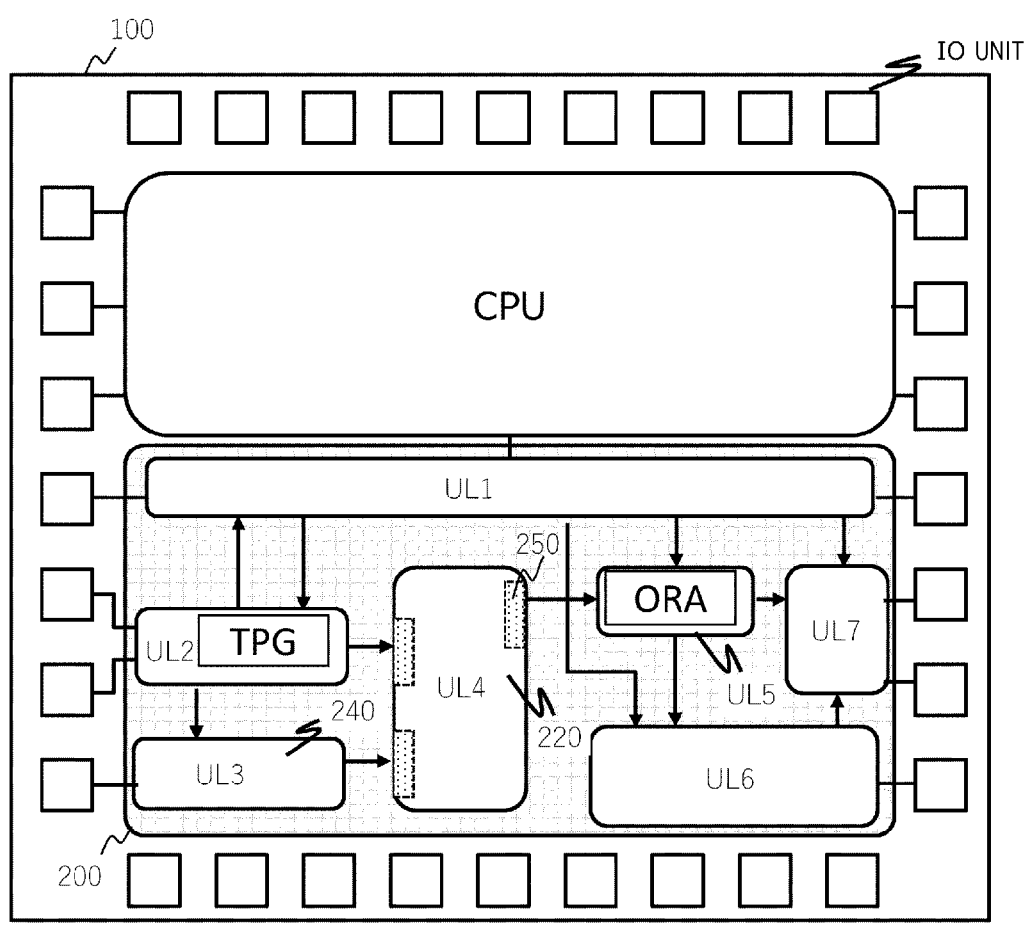
FIG. 10 is a view illustrating how a test is conducted according to modified example 2.

FIG. 10 is a view illustrating how a test is conducted according to modified example 2. In this example, the UL 4 is the test target circuit 220, and receives inputs from the test pattern generation units 210 formed in the UL 2, and the UL 3 which is the non-test circuit 240. The number of test patterns to be generated can be reduced compared to a case where the test pattern generation unit 210 is formed in the UL 3. Furthermore, in a case where a low-speed signal having little data fluctuation such as a register setting signal or a control signal of the test target circuit 220, an interrupt signal such as an error flag, or the like is applied as a test pattern, a test time becomes longer in proportion to the application. Test efficiency is improved by giving these signals from the non-test circuit 240.

Modified Example 4

At least one of the test execution control unit 300, the partition control unit 400, the data input unit 500, the configuration control unit 600, and the configuration data storage unit 700 may not be included in the programmable device 100. For example, all of the test execution control unit 300, the partition control unit 400, the data input unit 500, the configuration control unit 600, and the configuration data storage unit 700 may be included in another device, and this device and the programmable device may communicate with each other to execute processing similar to that of the first embodiment.

Figure 11:
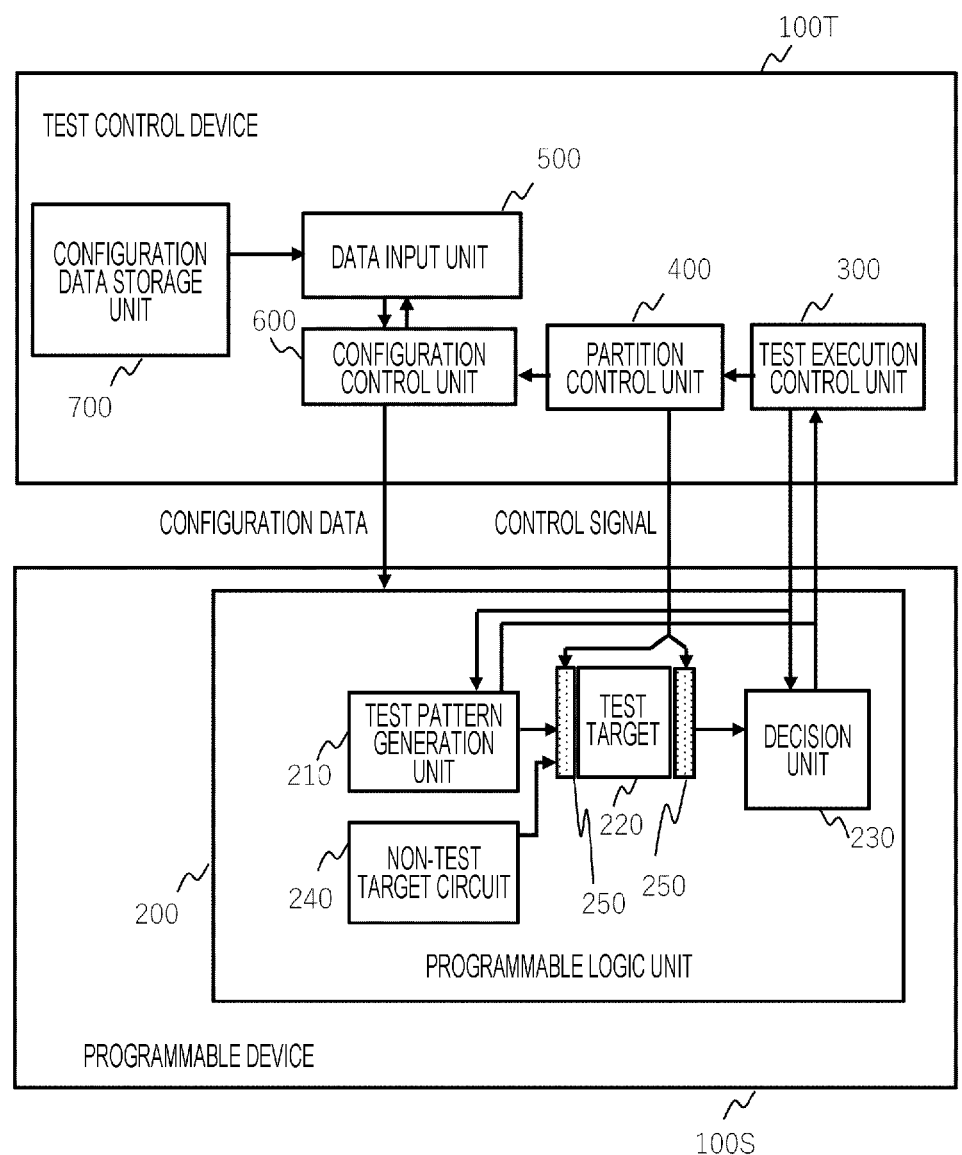
FIG. 11 is a schematic diagram of a test according to modified example 4.

FIG. 11 is a schematic diagram of a test according to modified example 4. In this modified example, a test control device 100T and a programmable device 100S communicate with each other, and perform processing similar to that of the first embodiment as a whole. The test control device 100T includes the test execution control unit 300, the partition control unit 400, the data input unit 500, the configuration control unit 600, and the configuration data storage unit 700. The programmable device 100S includes the programmable logic unit 200.

The test control device 100T may realize the test execution control unit 300, the partition control unit 400, the data input unit 500, and the configuration control unit 600 using a CPU, or by using an integrated circuit for specific usage or a rewritable logic circuit. The configuration data storage unit 700 is realized by using, for example, an ROM. Note that, although not illustrated in FIG. 11, the programmable device 100S may further include an ROM which stores configuration data, and a configuration which executes configuration.

That is, the test control device 100T according to this modified example is an arithmetic operation device which executes a test using the programmable device 100S including the partially reconfigurable programmable logic unit 200. The programmable logic unit 200 includes the test target circuit 220 which is the user circuit, and the non-test circuit 240 which is the user circuit which is not the test target circuit 220, and includes the configuration control unit 600 which causes the programmable logic unit 200 to form by partial reconfiguration the test partition unit 250 which separates the test target circuit 220 and the non-test circuit 240, and the partition control unit 400 which controls the test partition unit 250 to test the test target circuit 220. Consequently, by, for example, connecting the test control device 100T to the programmable device 100S which completes the operation alone, it is possible to efficiently execute the test control device in a short time.

Second Embodiment

The second embodiment of a programmable device which is an arithmetic operation device will be described with reference to FIG. 12. In the following description, the same components as those of the first embodiment will be assigned the same reference numerals, and differences will be mainly described. Points which are not specifically described are the same as those in the first embodiment. The present embodiment differs from the first embodiment mainly in that a plurality of user logic circuits are tested in parallel.

A test execution control unit 300 according to the present embodiment specifies a combination of user logic circuits which are not adjacent, in other words, which do not have a data input/output relationship, from a plurality of test target user logic circuits. Furthermore, the test execution control unit 300 tests the user logic circuits of the specified combination in parallel.

Figure 12:
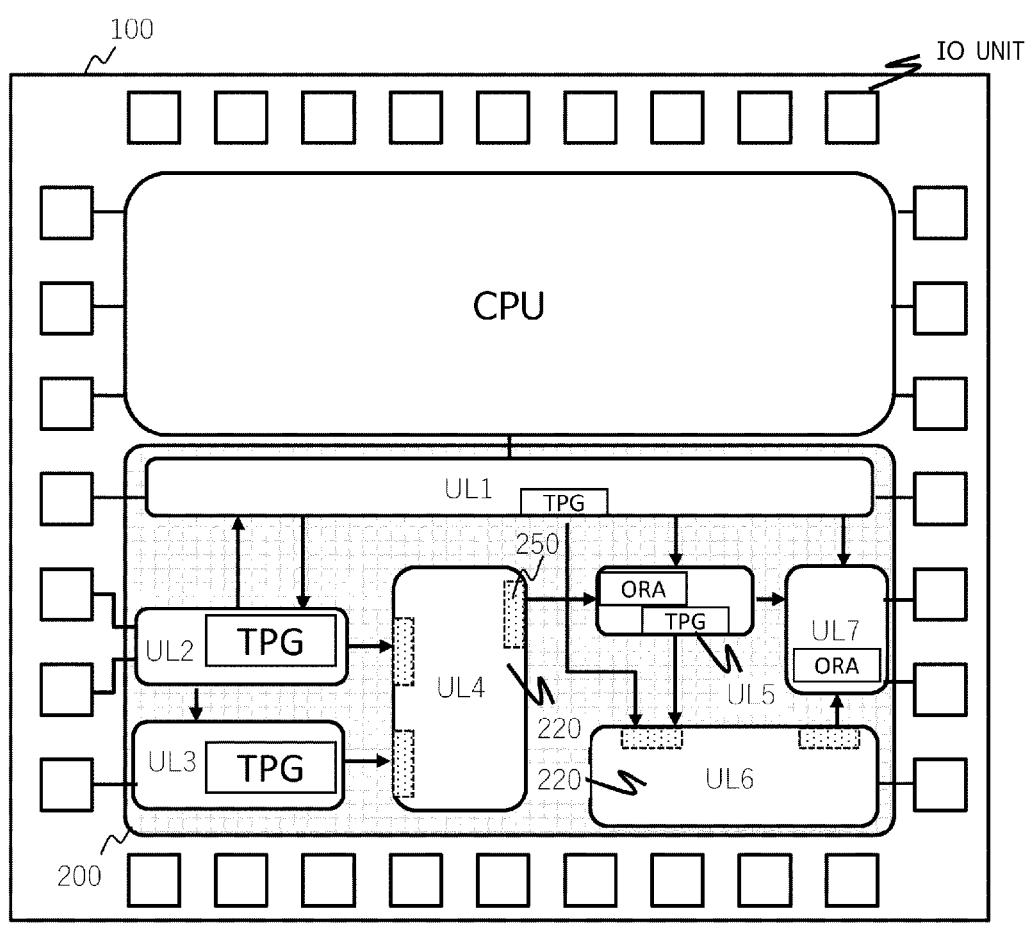
FIG. 12 is a view illustrating how a test is conducted according to a second embodiment.

FIG. 12 is a view illustrating how the test is conducted according to the second embodiment. In FIG. 12, a UL 4 and a UL 6 are test target circuits 220 to be tested in parallel. The UL 4 and the UL 6 do not have a data input/output relationship with each other, and therefore can be tested in parallel. Studying the combination of the UL 4 and a UL 5, it is necessary to write, in the UL 5, a decision unit 230 which decides an output of the UL 4, the original operation of UL 5 is hindered, and therefore the UL 4 and the UL 5 cannot be tested in parallel.

As illustrated in FIG. 12, the test execution control unit 300 causes a configuration control unit 600 to write test pattern generation units 210 in a UL 1, a UL 2, a UL 3, and the UL 5, and writes the decision units 230 in the UL 5 and a UL 7. Note that, although both the test pattern generation unit 210 and the decision unit 230 are written in the UL 5 in this example, it is not an essential requirement in the present embodiment that the test pattern generation unit 210 and the decision unit 230 are written in the same user logic circuit.

According to the above-described second embodiment, it is possible to further reduce a test time by reducing the number of times of tests and performing processing of conducting tests in parallel in addition to the functions and the effects of the first embodiment.

Third Embodiment

The third embodiment of a programmable device which is an arithmetic operation device will be described with reference to FIG. 13. In the following description, the same components as those of the first embodiment will be assigned the same reference numerals, and differences will be mainly described. Points which are not specifically described are the same as those in the first embodiment. The present embodiment differs from the first embodiment mainly in that a test target circuit 220 is tested while a non-test circuit 240 performs an arithmetic operation.

Figure 13:
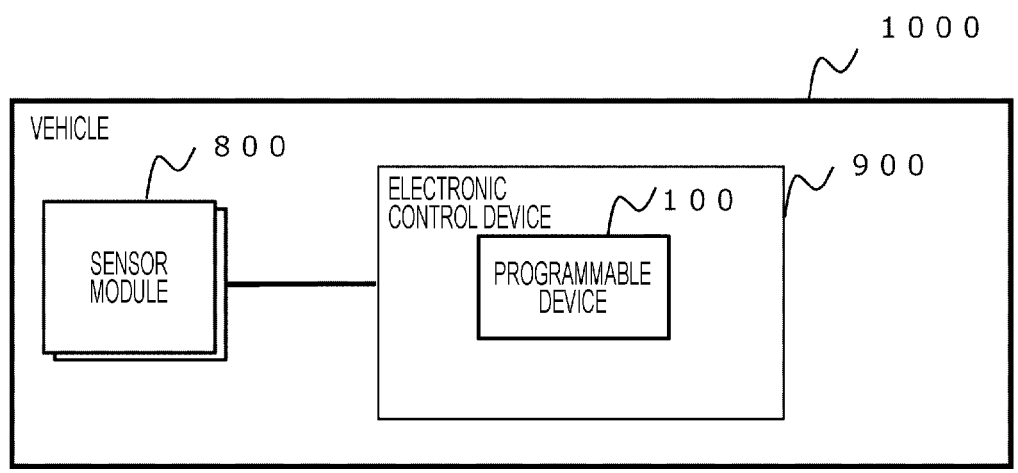
FIG. 13 is a configuration diagram of an in-vehicle control device according to a third embodiment.

FIG. 13 is a configuration diagram of an in-vehicle control device 900 according to the third embodiment. A vehicle 1000 includes a sensor module 800 which collects information on surroundings of the vehicle 1000, and the electronic control device 900 which includes a built-in programmable device 100. The information collected by the sensor module 800 is provided to the programmable device 100 of the electronic control device 900. Each user logic circuit written in a programmable logic unit 200 processes, for example, information collected by the sensor module 800.

A test execution control unit 300 detects whether each user logic circuit operates, sets one of the user logic circuits which are not operating as the test target circuit 220 to test. However, in a case where it is necessary to write at least one of a test pattern generation unit 210 and a decision unit 230 for the test, the test execution control unit 300 conducts the test on a condition that user logic circuits which need writing are not operating. For example, in the example of the user logic circuits illustrated in FIG. 3, a condition to test a UL 4 is that four user logic circuits of a UL 2 to a UL 5 are not operating.

According to the above-described third embodiment, it is possible to obtain following functions and effects in addition to the functions and the effects of the first embodiment.

(5) The test execution control unit detects whether or not the plurality of user circuits included in the programmable logic unit 200 operate, sets one of the user logic circuits which are not operating as the test target circuit to test. Consequently, it is possible to test user logic circuits which are not used according to an operation (during traveling, at a time of stopping or parking, and the like) during an operation of a car.

Fourth Embodiment

The fourth embodiment of a programmable device which is an arithmetic operation device will be described with reference to FIG. 14. In the following description, the same components as those of the third embodiment will be assigned the same reference numerals, and differences will be mainly described. Points which are not specifically described are the same as those in the third embodiment. The present embodiment differs from the first embodiment mainly in that communication is performed with an outside.

Figure 14:
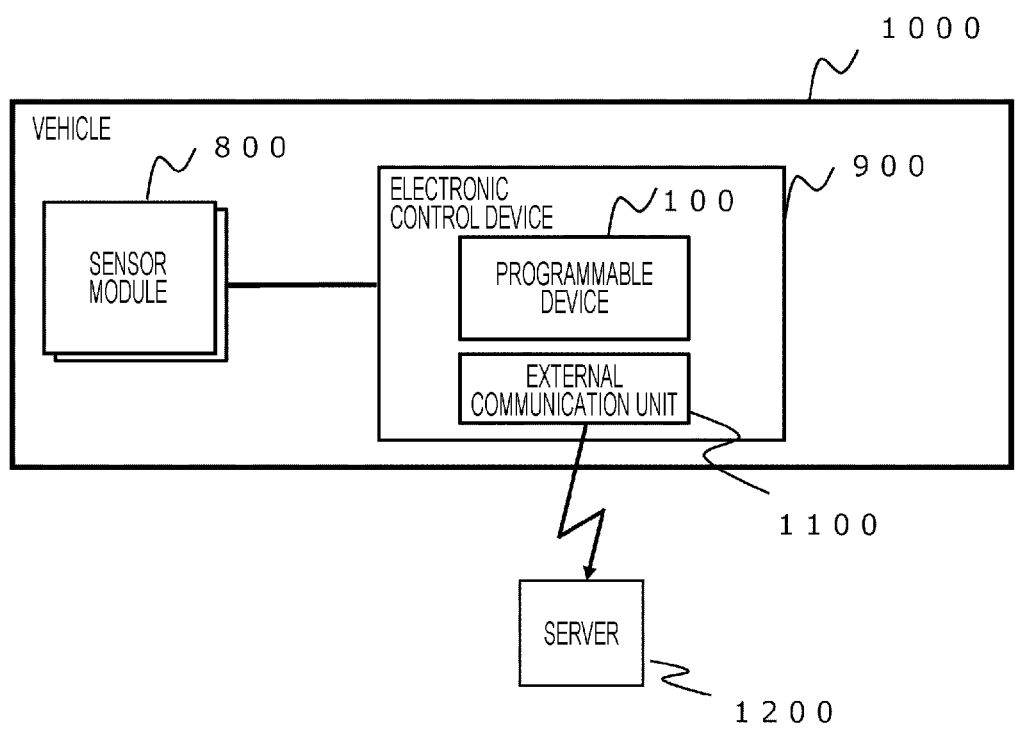
FIG. 14 is a configuration diagram of an in-vehicle control device according to a fourth embodiment.

FIG. 14 is a configuration diagram of an in-vehicle control device 900 according to the fourth embodiment. The in-vehicle control device 900 according to the present embodiment includes an external communication unit 1100 in addition to the components of the third embodiment. The external communication unit 1100 is a wireless communication device which communicates with the outside of a vehicle 1000. The external communication unit 1100 transmits a result of a test of a programmable device 100 to a server 1200 existing outside the vehicle 100.

According to the above-described fourth embodiment, it is possible to obtain following functions and effects in addition to the functions and the effects of the first embodiment.

(6) The external communication unit 1100 which transmits a test result of a test target circuit 220 by using wireless communication is provided. Consequently, the programmable device 100 can immediately transmit the test result to the outside. This test result can be regarded as a diagnosis result of a programmable logic unit 200, and consequently can be also used to monitor an operation of the programmable device 100 and evaluate reliability of a system. Furthermore, this test result can be monitored by the server 1200, and consequently is applicable to maintenance service and the like, too. Note that, it is possible to perform weighting for changing importance of a test target circuit such as a diagnosis cycle, a number of times of diagnosis, and the like of a circuit which affect safety such as a safety mechanism (failure detection circuit) related to safety of in-vehicle functions during an operation of the car, and improve safety of the in-vehicle electronic system, too.

In the above-described embodiments and modified examples, the configurations of the functional block are merely examples. Some functional configurations described as separate functional blocks may be integrally configured, or a configuration illustrated in one functional block diagram may be divided into two or more functions. Furthermore, there may be employed a configuration where part of the functions of each functional block may be included in another functional block.

The above-described embodiments and modified examples may be combined. Although various embodiments and modified examples have been described above, the present invention is not limited to these items of contents. Other aspects which are conceivable within the scope of the technical idea of the present invention are also included in the scope of the present invention.

REFERENCE SIGNS LIST

100, 100S programmable device
100T test control device
200 programmable logic unit
210 test pattern generation unit
220 test target circuit
230 decision unit 240 non-test circuit
250 test partition unit
300 test execution control unit
400 partition control unit
600 configuration control unit

The invention claimed is:

1. An arithmetic operation device which executes a test using a partially reconfigurable programmable logic unit, the programmable logic unit including a test target circuit which is a user circuit, and a non-test circuit which is a user circuit which is not the test target circuit, the arithmetic operation device comprising:
a configuration control unit which causes the programmable logic unit to form, by partial reconfiguration, a test partition unit which separates the test target circuit and the non-test circuit; and
a partition control unit which controls the test partition unit to test the test target circuit.

2. The arithmetic operation device according to claim 1, wherein the partition control unit switches between a separated state and a connected state between the test target circuit and the non-test circuit.

3. The arithmetic operation device according to claim 1, wherein
the configuration control unit further writes a test pattern generation unit and a decision unit in the programmable logic unit by the partial reconfiguration, the test pattern generation unit generating a signal for the test and outputting the signal to the test target circuit, the decision unit deciding an output of the test target circuit, and
the arithmetic operation device further comprises a test execution control unit which transmits an operation command to the partition control unit and the test pattern generation unit, and receives a decision result from the decision unit.

4. The arithmetic operation device according to claim 3, wherein the configuration control unit further writes the test target circuit in the programmable logic unit by the partial reconfiguration.

5. The arithmetic operation device according to claim 3, wherein the test execution control unit detects whether or not a plurality of the user circuits included in the programmable logic unit 200 operate, and sets one of user logic circuits which are not operating as the test target circuit to test.

6. The arithmetic operation device according to claim 1, further comprising an external communication unit which transmits a test result of the test target circuit by using wireless communication.

7. A testing method executed by a computer using a partially reconfigurable programmable logic unit, the testing method comprising:
causing the programmable logic unit to form a test partition unit by partial reconfiguration, the programmable logic unit including a test target circuit which is a user circuit, and a non-test circuit which is a user circuit which is not the test target circuit, the test partition unit separating the test target circuit and the non-test circuit; and
controlling the test partition unit to test the test target circuit.

8. The testing method according to claim 7, further comprising writing a test pattern generation unit and a decision unit in the programmable logic unit by the partial reconfiguration, the test pattern generation unit generating a signal for the test and outputting the signal to the test target circuit, the decision unit deciding an output of the test target circuit.

* * * * *